(12) United States Patent
Xia

(10) Patent No.: US 9,343,471 B2
(45) Date of Patent: May 17, 2016

(54) EMBEDDED FLASH MEMORY

(75) Inventor: Wei Xia, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 434 days.

(21) Appl. No.: 13/425,575

(22) Filed: Mar. 21, 2012

(65) Prior Publication Data
US 2013/0248961 A1 Sep. 26, 2013

(51) Int. Cl.
H01L 29/788 (2006.01)
H01L 21/336 (2006.01)
H01L 27/115 (2006.01)
H01L 21/28 (2006.01)
H01L 29/423 (2006.01)

(52) U.S. Cl.
CPC .... *H01L 27/11543* (2013.01); *H01L 21/28273* (2013.01); *H01L 29/42324* (2013.01); *H01L 29/7883* (2013.01)

(58) Field of Classification Search
None
See application file for complete search history.

(56) References Cited

U.S. PATENT DOCUMENTS 6,117,725 A * 9/2000 Huang ........................ 438/241
6,211,548 B1 4/2001 Ma
6,380,032 B1 * 4/2002 Lee et al. ..................... 438/257
2005/0212033 A1 9/2005 Forbes
2006/0054943 A1 3/2006 Li et al.
2006/0170028 A1 8/2006 Jeon et al.
2007/0132001 A1 6/2007 Wang et al.
2011/0014757 A1 * 1/2011 Zhu ............................. 438/211
2011/0108903 A1 5/2011 Xia et al.

FOREIGN PATENT DOCUMENTS

KR 1020100005062 1/2010

OTHER PUBLICATIONS

European Search Report in co-pending related EP Application No. 12005865.6, mailed Sep. 18, 2013.
Taiwanese Office Action issued Jul. 24, 2014 in Taiwan Application No. 101133040 (no English translation), 5 pages.
Chinese Office Acton issued Dec. 22, 2015, for Chinese Patent Application No. 201210365277.5.

* cited by examiner

*Primary Examiner* — Robert Carpenter
(74) *Attorney, Agent, or Firm* — Oblon, McClelland, Maier & Neustadt, L.L.P.

(57) ABSTRACT

An embedded flash memory cell and a corresponding method for fabricating the embedded flash memory cell are disclosed. In some embodiments, the flash memory cell comprises a floating gate that has been formed using a metal gate and local interconnect metal. For some embodiments, the embedded flash memory can be fabricated with little-to-no additional processes than what one would normally employ in fabricating a metal-oxide semiconductor field-effect transistor (MOSFET).

20 Claims, 6 Drawing Sheets

EMBEDDED FLASH MEMORY

BACKGROUND

1. Field of the Disclosure

The present disclosure relates generally to semiconductors and, more particularly, to embedded flash memory.

2. Description of Related Art

Semiconductor-based memory has now become ubiquitous in view of increasing demands for computing power and data storage. Given the popularity of these devices, there are ongoing efforts to improve fabrication processes as well as the resulting semiconductor devices.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Given the popularity of semiconductor-based memory devices, there are ongoing efforts to improve both the fabrication processes as well as the end-product of those processes. For example, there are ongoing efforts to provide an embedded flash memory on the same chip as an application-specific integrated circuit (ASIC), thereby providing integration of a non-volatile memory with the ASIC.

Figure 1:
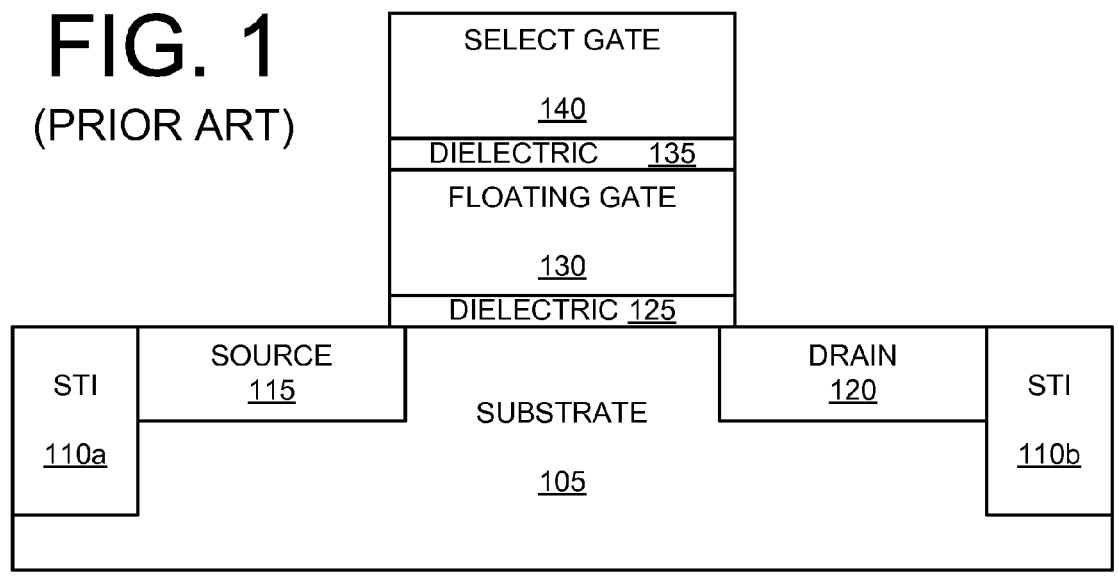
FIG. 1 is a diagram showing a prior art flash memory cell.

A conventional flash memory cell, which is shown in FIG. 1, includes a substrate 105, source 115, drain 120, shallow trench isolation 110a, 110b, floating-gate dielectric layer 125, a poly-silicon floating gate 130, a select-gate dielectric layer 135, and a poly-silicon select gate 140. As one can imagine, to embed this type of flash memory in the same chip often requires seven (or more) additional masks. These additional masks (and processes) increase cycle time, increase cost, and reduce product yield.

Figure 2:
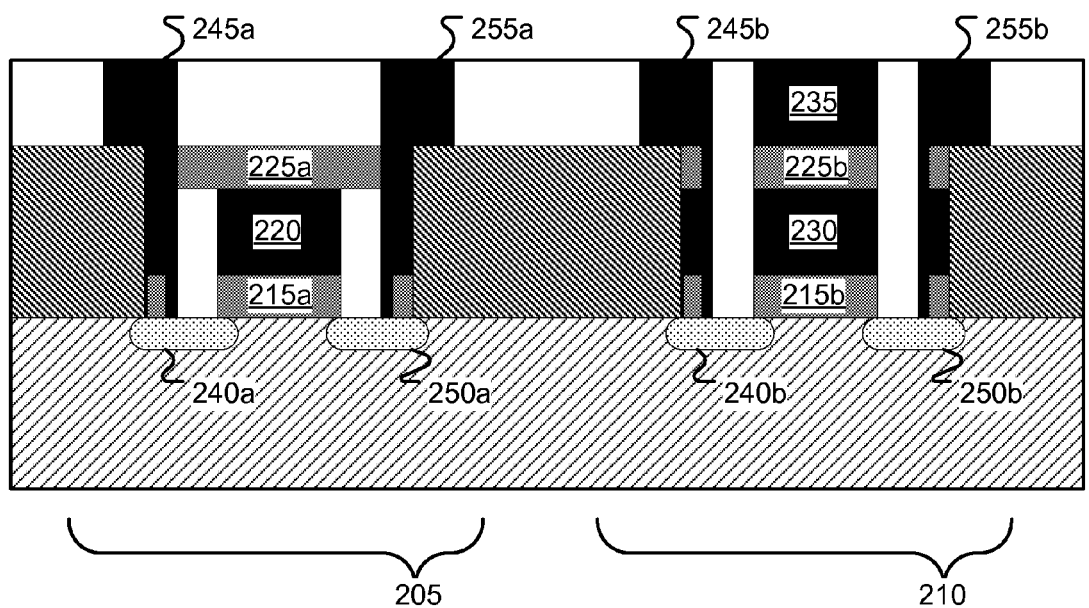
FIG. 2 is a diagram showing one embodiment of a flash memory cell formed using a metal gate and local interconnect metals, similar to those found in a metal-oxide semiconductor field-effect transistor (MOSFET).
Figure 7:
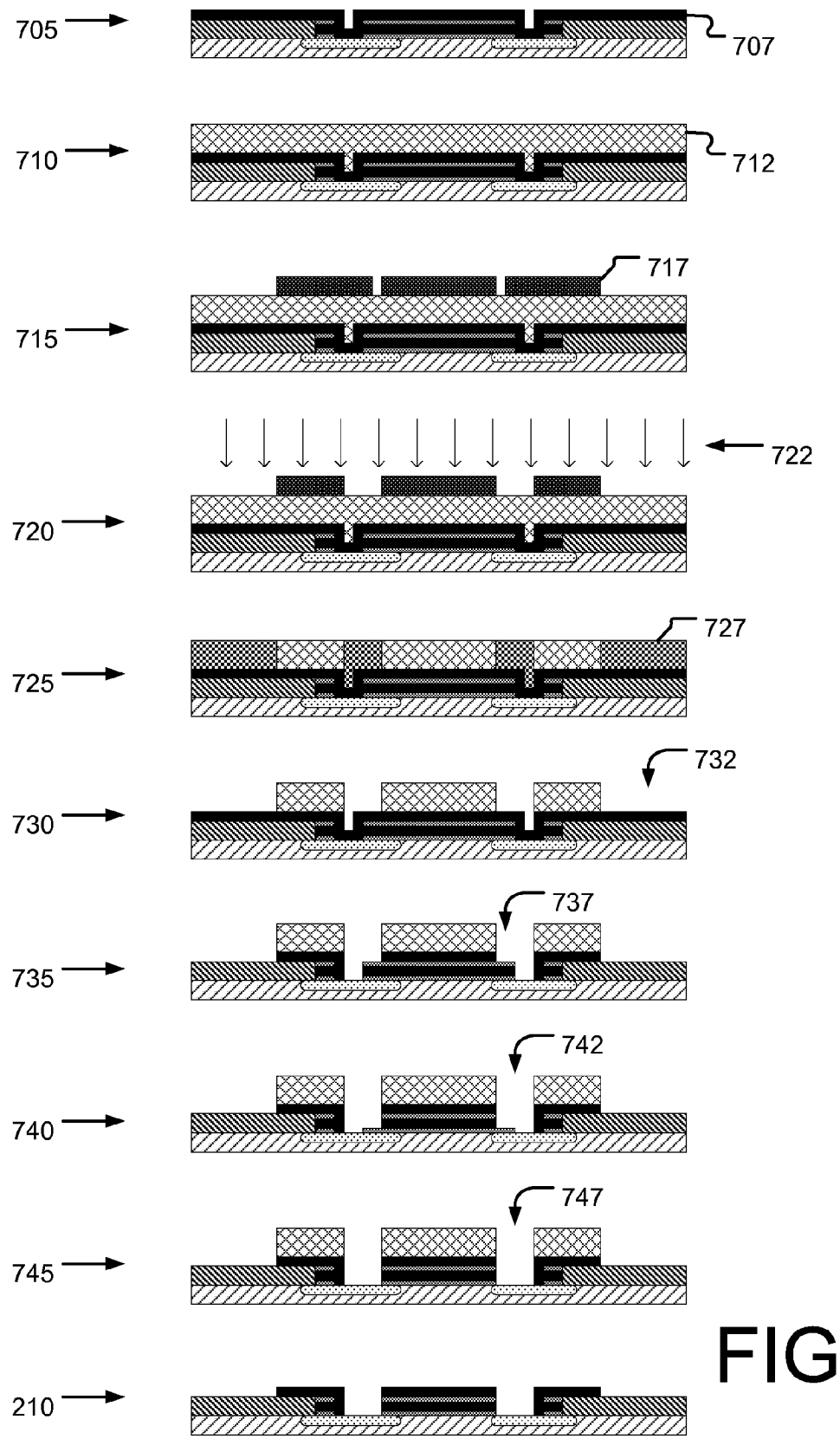
FIG. 7 shows a series of steps for fabricating metal contacts and finalizing the fabrication of one embodiment of the flash memory cell.

Unlike the prior-art flash memory of FIG. 1, the inventive flash memory cell, as shown in the embodiments of FIGS. 2 and 7, utilize metal local interconnect technology. To the extent that metal local interconnect technology is used for devices on the scale of about 20 nm, the fabrication process for local interconnect metal (e.g., fabrication processes for metal-oxide semiconductor field-effect transistor (MOSFET)) can also be used to fabricate a floating-gate flash-memory structure.

Insofar as the flash memory is compatible with existing logic processes using a high-dielectric-constant (high "K") metal gate oxide layer and metal local interconnect processes, the embedded flash structure of FIG. 2 can be fabricated with very little (if any) additional resources. Specifically, to the extent that the fabrication process already results in a high-K metal gate oxide layer, along with the appropriate metal local interconnects, some embodiments of the embedded flash cell can be fabricated with little-to-no additional processes and no additional masks. One embodiment of a metal-oxide-based flash cell is shown in FIG. 2, while one embodiment of a fabrication process, along with the resulting semiconductor layers, is shown with reference to FIGS. 3 through 7.

Reference is now made in detail to the description of the embodiments as illustrated in FIGS. 2 through 7. While several embodiments are described in connection with these drawings, there is no intent to limit the disclosure to the embodiment or embodiments disclosed herein. On the contrary, the intent is to cover all alternatives, modifications, and equivalents.

FIG. 2 is a diagram showing one embodiment of a flash memory cell formed using a metal gate and local interconnect metals, similar to those found in a metal-oxide semiconductor field-effect transistor (MOSFET). For clarity, FIG. 2 shows a standard MOSFET 205 (on the left) side-by-side with one embodiment of the inventive flash memory cell 210 (on the right). For simplicity, the flash memory cell 210 is also referred to herein as a flash memory, flash cell, or flash. This side-by-side comparison is provided to demonstrate how the same processes can be used to fabricate both the flash cell 210 and the MOSFET 205.

Thus, as shown in FIG. 2, the standard MOSFET 205 comprises a source 240a and a drain 250a. Similarly, the flash cell 210 also comprises a source 240b and a drain 250b. These sources 240a, 240b and drains 250a, 250b can be formed using the same fabrication processes.

The standard MOSFET 205 also comprises a gate oxide layer 215a with a metal gate 220 that is deposited atop the gate oxide layer 215a. Similarly, the flash cell 210 comprises a gate oxide layer 215b with a metal floating gate 230 that is deposited atop the gate oxide layer 215b. For some embodiments, this oxide layer 215a, 215b is fabricated by growing a high-dielectric-constant (or high-K) material on to a substrate. For the flash cell 210 the gate oxide layer 215b serves as the floating gate oxide layer, while for the MOSFET 205 the oxide layer 215a serves as the metal-gate oxide layer. FIG. 2 further shows another oxide layer 225a that is grown atop the metal gate 220 for the MOSFET 205. Similarly, the flash cell 210 comprises an oxide layer 225b that is grown atop the floating gate 230. For some embodiments, this oxide layer 225a, 225b is a barrier nitride layer. In the flash cell 210, this oxide layer 225b serves as a select-gate oxide layer.

As one can see from the side-by-side comparison of FIG. 2, the gate oxide layer 215a for the MOSFET 205 and the gate oxide layer 215b for the flash cell 210 can be formed by the same fabrication processes since these oxide layers 215a, 215b are grown with the same materials. Similarly, the metal gate 220 of the MOSFET 205 and the floating gate 230 of the flash cell 205 can be formed by the same fabrication processes since these gates 220, 230 are formed from the same metal. Likewise, the manufacturing process can be the same for the oxide layer (e.g., barrier nitride layer) 225a on the MOSFET 205 and the oxide layer 225b on the flash cell 210.

FIG. 2 also shows the MOSFET 205 comprising a first metal interconnect 245a to the source 240a, and a second metal interconnect 255a to the drain 250a. Similarly, FIG. 2 shows the flash cell 210 comprising a first metal interconnect 245b to the source 240b and a second metal interconnect 255b to the drain 250b. To the extent that these interconnects 240a, 240b, 250a, 250b are fabricated from the same materials, the interconnects 245b, 255b for the flash cell 210 and the interconnects 245a, 255a for the MOSFET 205 can be formed using the same fabrication processes.

Lastly, FIG. 2 shows how the flash cell 210 can be fabricated by simply changing a mask to allow for deposition of a metal select gate 235. In other words, while the process for fabricating the MOSFET 205 results in all but the metal interconnects 245a, 255a being etched away, the fabrication process for the flash cell 210 results in one more metal segment (e.g., the metal select gate 235) being preserved during the etching process. As such, the flash cell 210 can be fabricated with very little changes to the MOSFET 205 fabrication process.

FIGS. 3 through 7 show one embodiment of a fabrication process for creating a flash cell 205. As shown in FIGS. 3 through 7, this embodiment of the fabrication process results in the flash cell 205, where the floating gate 230 and the select gate 235 are formed using the metal gate and local interconnect metal, thereby requiring very little additional fabrication processes.

Figure 3:
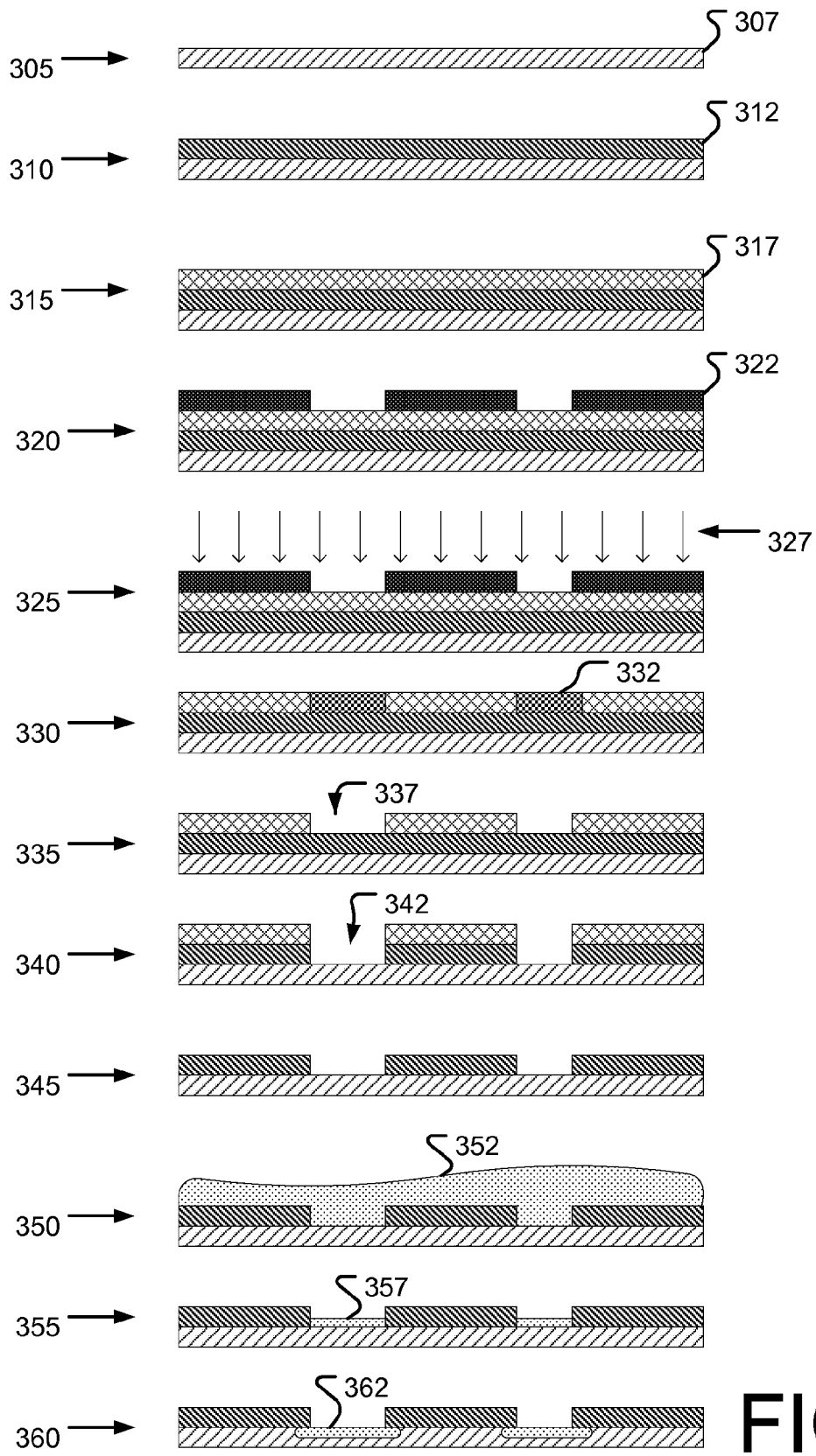
FIG. 3 shows a series of steps for fabricating a source and a drain for one embodiment of the flash memory cell.

FIG. 3 shows a series of steps for fabricating a source and a drain for one embodiment of the flash memory cell. As shown in FIG. 3, the process for fabricating the source 240b and the drain 250b of the flash cell 210 are substantially identical to the process for fabricating the source 240a and the drain 250a of the MOSFET 205. For purposes of illustration, the processes of FIGS. 3 through 7 show a fabrication of a negative-channel metal-oxide semiconductor (N-MOS).

The fabrication process of FIG. 3 begins by providing 305 a substrate 307. For some embodiments, the substrate 307 is a positively-doped (p-doped) silicon wafer. A field-oxide layer 312 is thermally grown 310 onto the substrate 307 by placing the substrate 307 into a tube furnace for about an hour, at a temperature of approximately 1100 degrees centigrade, which results in a field-oxide layer 312 that is approximately 500 nanometers (nm) in thickness. Thereafter, a photoresist layer 317 is spun 315 onto the field-oxide layer 312, and the wafer is soft-baked for approximately a minute. Subsequently, a doping mask 322 is placed 320 over the photoresist layer 317 using an aligner, which allows portions of the photoresist layer 317 to be exposed 325 to ultraviolet (UV) light 327. Once the doping mask 322 is removed 330, the exposed portions 322 are ready for removal 335 by developing the photoresist layer 317 in a developing solution for about a minute.

Upon removal 330 of the exposed portions 322, the resulting wafer is hard baked 335 for about a minute at approximately 110 degrees centigrade. The baking process 335 substantially immunizes the photoresist layer 317 from a buffered oxide etch (BOE) that is used to etch 340 the exposed portion 337 of the field-oxide layer 312. The exposed portion 337 of the field-oxide layer 317 is etched away, and the remaining photoresist is removed 345 using acetone or alcohol or other appropriate cleaner. This leaves two (2) windows in the field-oxide layer 317.

A dopant source 352, such as a phosphorous-doped material, is applied 350 and cured in a vacuum oven at about 140 degrees centigrade for approximately an hour. After the dopant source 352 is cured, the resulting wafer is subjected to a predeposition process for approximately ninety (90) minutes at a temperature of about 1000 degrees centigrade. Once the predeposition process is completed, excess dopant source 352 is removed 355 by etching, thereby leaving only a layer 357 of the dopant in the field-oxide layer window. The resulting wafer is baked for about eight (8) hours in a dry-oxygen environment at a temperature of approximately 1050 degrees centigrade, which results in the phosphorous-doped material being diffused 360 into the substrate to form the source 362 and the drain.

Figure 4:
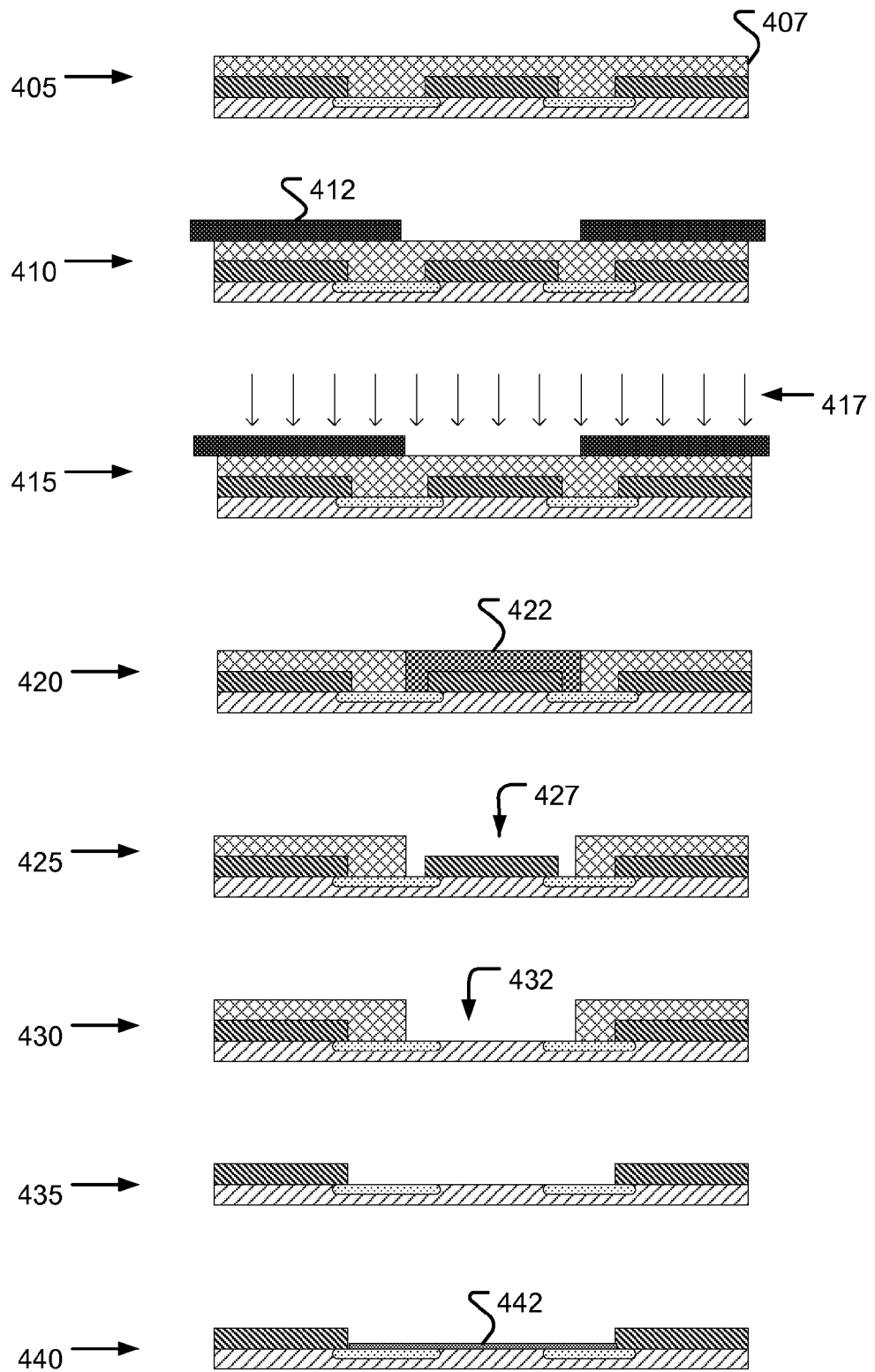
FIG. 4 shows a series of steps for depositing a gate oxide layer in one embodiment of the flash memory cell.

FIG. 4 shows a series of steps for depositing a gate oxide layer in one embodiment of the flash memory cell. Specifically, FIG. 4 shows the formation of a floating gate oxide layer. As such, the process shown in FIG. 4 continues from the process shown in FIG. 3. Thus, after the formation 360 of the drain and source, the wafer is coated 405 with photoresist 407, and an etching mask 412 is placed 410 on the wafer. The wafer is then exposed 415 to UV 417 radiation, which results 420 in an exposed section 422 of the photoresist 407. That photoresist 407 is then developed 425 to remove the exposed section 422 to reveal a portion of the oxide layer 427.

The wafer is then hard-baked and etched 430 to remove the exposed portion 427 of the oxide layer using the BOE. The remaining photoresist 407 is the removed 435. Thereafter, a high-quality gate oxide layer 442 is grown 440 onto the wafer by once again placing the wafer in the tube furnace at about 1100 degrees centigrade in oxygen, until the gate-oxide layer reaches about 100 nm in thickness. The process then continues to FIG. 5.

Figure 5:
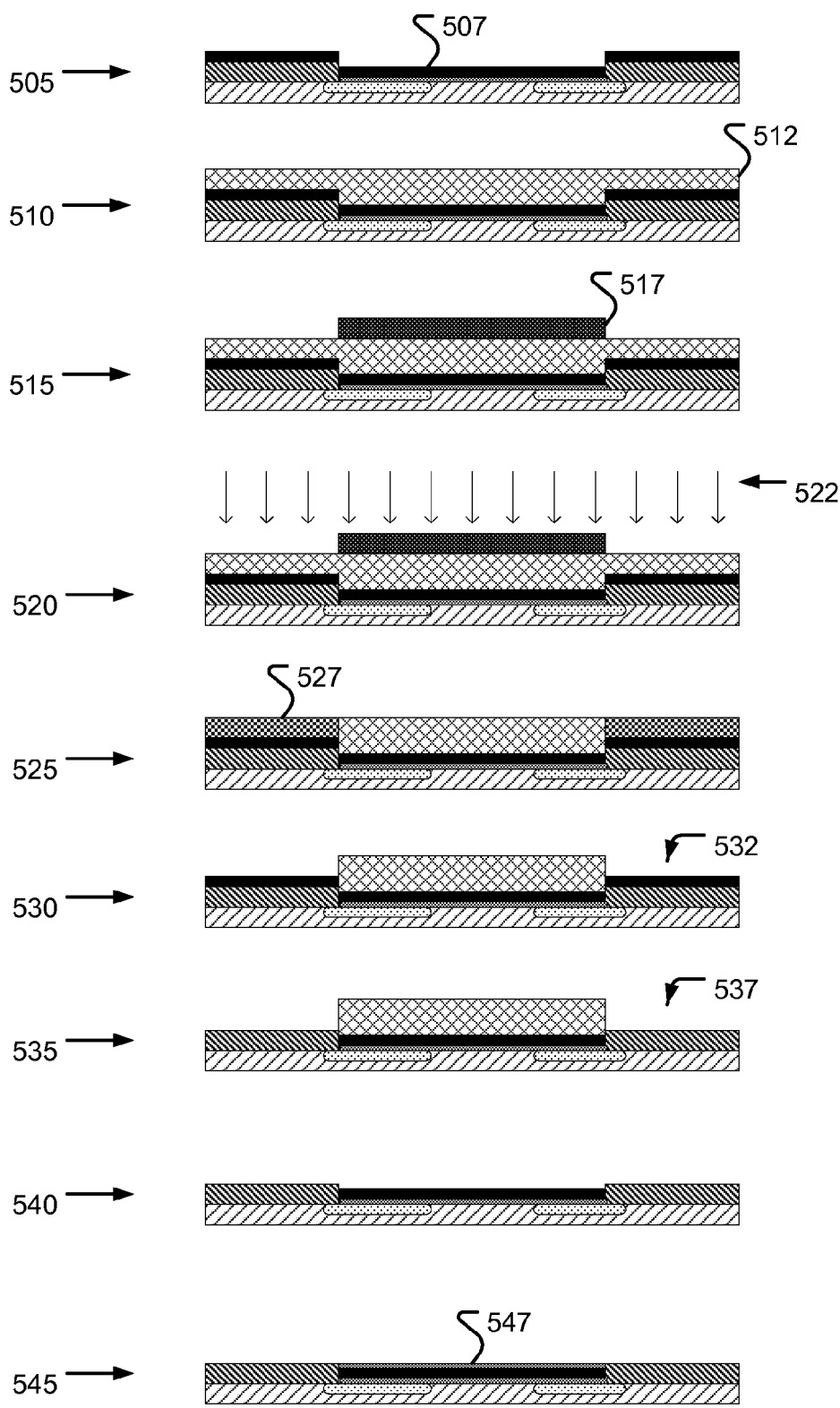
FIG. 5 shows a series of steps for fabricating a floating gate for one embodiment of the flash memory cell.

FIG. 5 shows a series of steps for fabricating a floating gate for one embodiment of the flash memory cell. As shown in FIG. 5, a layer of metal 507 is deposited 505 onto the wafer. To do so, the wafer is placed in an evaporator (e.g., thermal evaporator, e-beam evaporator, etc.), and about 500 nm of metal (e.g., aluminum) is evaporated onto the surface of the wafer. Once again, a photoresist 512 is spun 510 onto the wafer, a gate mask 517 is placed 515 on the photoresist, and portions of the photoresist are exposed 520 to UV radiation 522, thereby producing 525 exposed photoresist 527 when the gate mask 517 is eventually removed from the wafer.

The exposed photoresist 527 is then developed 530 to remove the exposed section 527 to reveal a portion of the metal layer 532. The wafer is then hard-baked and the metal layer is etched 535 using a metal etchant, which is heated to about fifty (50) degrees centigrade, to remove the metal 537. The remaining photoresist 512 is then removed using a cleaner (e.g., acetone, alcohol, etc.), the metal is annealed 540. Thereafter, a high-quality select-gate-oxide layer 547 is grown 545 onto the wafer by placing the wafer in a tube furnace at about 1100 degrees centigrade in oxygen, until the select-gate-oxide layer 547 reaches about 100 nm in thickness. The process then continues to FIG. 6.

Figure 6:
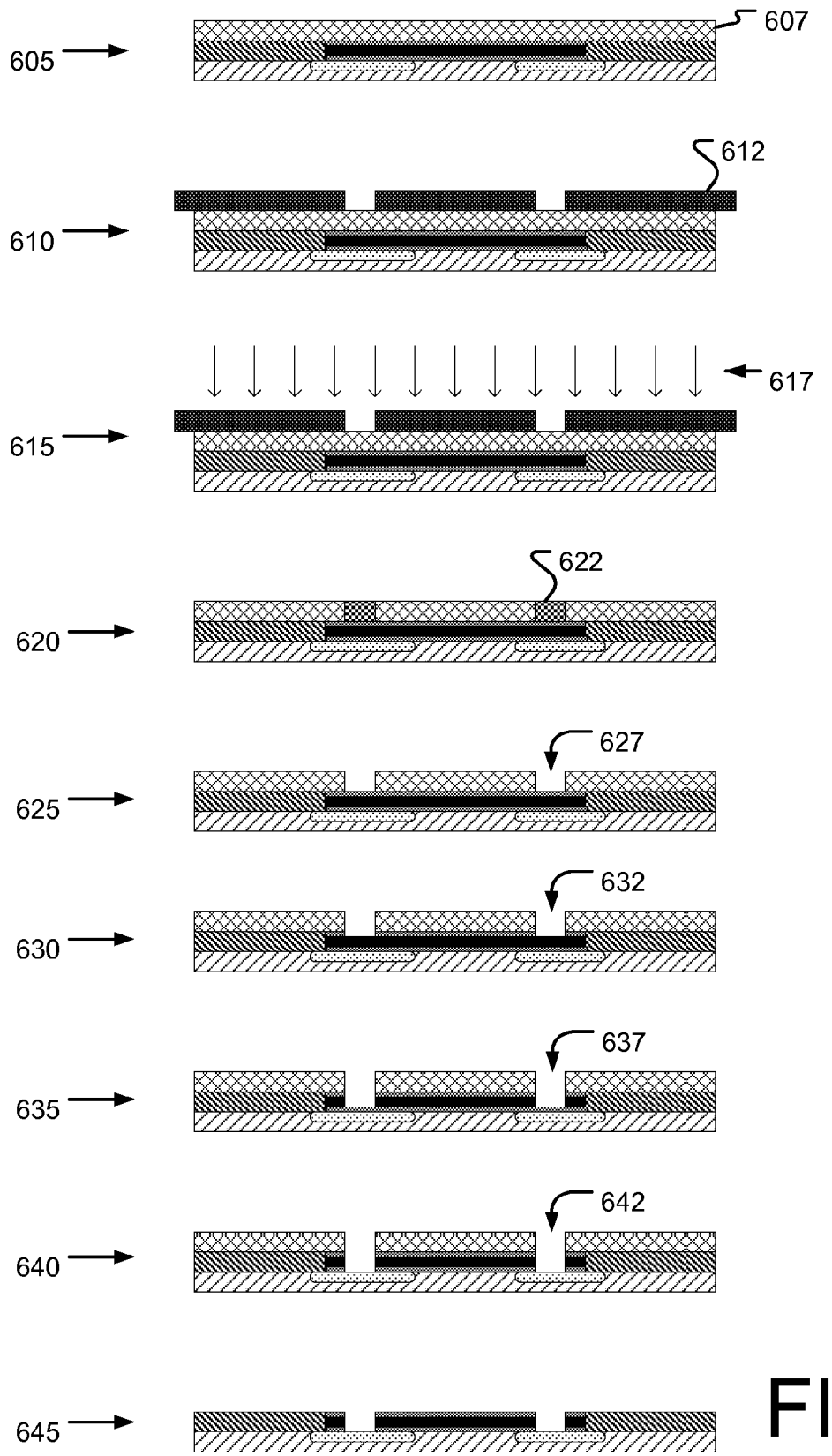
FIG. 6 shows a series of steps for fabricating interconnect vias for one embodiment of the flash memory cell.

FIG. 6 shows a series of steps for fabricating interconnect vias for one embodiment of the flash memory cell. These vias allow metal connections to the doped regions. Thus, from the process of FIG. 5, another layer of photoresist 607 is spun 605 onto the wafer, and a via mask 612 is applied 610 onto the photoresist 607. The masked wafer is then exposed 615 to UV radiation 617 to produce 620 exposed photoresist 622. The photoresist is developed 625, using processes that are similar to those described above, thereby resulting in gaps 627.

After hard-baking the wafer, the exposed section of the select-gate-oxide layer 627 is sequentially: etched 630 using BOE to remove the exposed select-gate-oxide layer 627; etched 635 using a metal etchant to remove the exposed section of the select-gate-oxide layer 632; and etched 640 using BOE to remove the exposed section of the floating-gate oxide layer 642. Upon etching 630, 635, 640, when the doped regions (source and drain) are exposed, the remaining photoresist 607 is once again removed using a cleaner, such as acetone, alcohol, or other suitable solution. Once the fabrication process for the vias is completed according to FIG. 6, the process continues to FIG. 7.

FIG. 7 shows a series of steps for fabricating metal contacts and finalizing the fabrication of one embodiment of the flash memory cell. As shown in FIG. 7 a layer of metal 707 (e.g., aluminum) is deposited 705 onto the wafer by placing the wafer in an evaporator (e.g., thermal evaporator, e-beam evaporator, etc.). This results in about 500 nm of metal being evaporated (or deposited) onto the surface of the wafer. Select portions of this metal layer 707 will eventually become the select gate, the source contact, and the drain contact.

A layer of photoresist 712 layer is then spun 710 onto the deposited 705 metal layer 707, and a metal-contact mask 717 is applied 715 to the photoresist 712 layer. The masked wafer is then exposed 720 to UV light 722 (also referred to as UV radiation), which results in exposed photoresist 727 upon removal 725 of the metal-contact mask 717. Once again, the photoresist 712 is developed 730, thereby removing the exposed photoresist 727 and revealing a portion 732 of the deposited 705 metal layer 707. The resulting wafer is then hard-baked to immunize the remaining photoresist to the etchant.

After hard-baking, the exposed metal layer 732 is etched 735 using a metal etchant that is heated to 50 degrees centigrade. The exposed high-quality select-gate oxide layer 737 is subsequently etched 735 using a BOE solution. Thereafter, the remaining exposed metal layer 742 is etched 740. And, during the last etching step 745, the remaining high-quality floating-gate oxide layer 747 is etched using a BOE solution. Thereafter the remaining photoresist 707 is removed.

For the final stage of the fabrication process, the metal is annealed in a tube furnace, thereby lowering the contact resistance between the metal and the silicon regions. For some embodiments, the wafers are annealed at about 450 degrees centigrade for approximately ten minutes in an atmosphere of diazene ($H_2N_2$). The resulting flash cell 210 (also in FIG. 2) comprises a floating gate 230, which has been fabricated using the same process that fabricates a metal gate in a MOSFET-fabrication process, and a select gate 235, which has been fabricated using the same interconnect metal that is used in a MOSFET. As such, the flash cell 210 can be fabricated with very few modifications to a MOSFET-fabrication process. Hence, the process as set forth in FIGS. 3 through 7 permit an elegant fabrication process for an embedded flash memory.

By providing a method of fabricating such an embedded flash, with little-to-no additional process steps than what currently exists for MOSFET fabrication, the various embodiments of the invention provide for integration of non-volatile memory with application-specific integrated circuits (ASIC).

Although exemplary embodiments have been shown and described, it will be clear to those of ordinary skill in the art that a number of changes, modifications, or alterations to the disclosure as described may be made. For example, while a negative-channel metal-oxide semiconductor (N-MOS) is shown in these embodiments, it should be appreciated that the processes can readily be applied in the context of a positive-channel metal-oxide semiconductor (P-MOS). Additionally, while specific temperature ranges and times are provided for clarity, it should be appreciated that these ranges and times are solely provided for illustrative purposes. As such, one having skill in the art will appreciate that those ranges and times can be varied, depending on fabrication conditions and materials, to achieve comparable results. All such changes, modifications, variations, and alterations should therefore be seen as within the scope of the disclosure.

What is claimed is:

1. A memory device, comprising:
a floating gate including a metal;
a dielectric portion located on the floating gate;
a select gate located on the dielectric portion, the select gate including the metal; and
a metal interconnect disposed adjacent to the floating gate, the dielectric portion, and the select gate, wherein:
a first portion of the metal interconnect extends within a first plane and a second portion of the metal interconnect extends within a second plane, the second plane being parallel to the first plane;
a third portion of the metal interconnect extends within a third plane, the third plane being perpendicular to the first plane and the second plane; and
an upper surface of the metal interconnect and an upper surface of the select gate extend on a same plane as one another.

2. The memory device of claim 1, further comprising:
a substrate.

3. The memory device of claim 2, further comprising:
a source located on the substrate.

4. The memory device of claim 2, further comprising:
a drain located on the substrate.

5. The memory device of claim 2, further comprising:
a floating gate dielectric portion located on the substrate.

6. The memory device of claim 5, wherein
the floating gate is located on the floating gate dielectric portion.

7. The memory device of claim 1, wherein the dielectric portion is a select-gate dielectric portion.

8. The memory device of claim 2, further comprising:
a source located on the substrate; and
a drain located on the substrate.

9. The memory device of claim 8, wherein
the metal interconnect is connected to the source and includes the metal.

10. The memory device of claim 8, wherein
the metal interconnect is connected to the drain and includes the metal.

11. The memory device of claim 8, further comprising:
means for coupling the source to the drain.

12. The memory device of claim 1, further comprising:
means for transmitting a current to the select gate.

13. The memory device of claim 1, wherein
the metal interconnect is configured to transmit a current to the select gate.

14. The memory device of claim 1, wherein a cross-section of the metal interconnect is an F-shape.

15. The memory device of claim 1, wherein the first portion is larger in size than the second portion.

16. The memory device of claim 1, wherein the first portion, the second portion, and the third portion are connected with each other.

17. The memory device of claim 2, wherein the second portion is in between the first portion and the substrate.

18. The memory device of claim 17, wherein the first portion, the second portion, and the third portion are connected with each other.

19. A memory device, comprising:
a dielectric portion;
a select gate located on the dielectric portion; and
a metal interconnect disposed adjacent to the dielectric portion and the select gate, wherein:

a first portion of the metal interconnect extends within a first plane and a second portion of the metal interconnect extends within a second plane, the second plane being parallel to the first plane;

a third portion of the metal interconnect extends within a third plane, the third plane being perpendicular to the first plane and the second plane; and the metal interconnect has a cross-section that is an F-shape.

20. A memory device, comprising:

a dielectric portion;

a select gate located on the dielectric portion; and a metal interconnect disposed adjacent to the dielectric portion and the select gate, wherein:

a first portion of the metal interconnect extends within a first plane and a second portion of the metal interconnect extends within a second plane, the second plane being parallel to the first plane;

a third portion of the metal interconnect extends within a third plane, the third plane being perpendicular to the first plane and the second plane; and the metal interconnect has a cross-section that is a reverse F-shape.

* * * * *